(12) United States Patent
Pertijs et al.

(10) Patent No.: US 6,456,145 B1
(45) Date of Patent: Sep. 24, 2002

(54) NON-LINEAR SIGNAL CORRECTION

(75) Inventors: Michiel A. P. Pertijs, Delft (NL); Anthonius Bakker, Delft (NL); Johan H. Huijsing, Schipluiden (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/672,806

(22) Filed: Sep. 28, 2000

(51) Int. Cl.[7] ................................. G06G 7/12
(52) U.S. Cl. ...................... 327/362; 133/306
(58) Field of Search ................ 327/362, 512, 327/513, 100, 133, 306

(56) References Cited

U.S. PATENT DOCUMENTS 6,236,947 B1 * 5/2001 Dowling et al. ............. 702/38

\* cited by examiner

*Primary Examiner*—Dinh T. Le
(74) *Attorney, Agent, or Firm*—Peter Zawilski

(57) ABSTRACT

Signal correction in a bipolar transistor circuit having a base-emitter voltage and a non-linear output signal corresponding to a detectable characteristic is improved by correcting non-linearity in the signal at third and/or higher-orders. According to an example embodiment of the present invention, the output of the transistor circuit is corrected as a function of the base-emitter voltage, the non-linear output signal and a generated non-linearity. The generated non-linearity is adapted to cancel the non-linearity of the non-linear output signal. Various implementations of the present invention are applicable to a variety of applications, each of which may have selected characteristics that are accounted for by the generated non-linearity, which is selectively adapted for each particular application. In one implementation, the non-linearity is generated using two or more division circuits. In this manner, third and higher-order corrections can be made, and the detection of characteristics such as data, temperature and other terms is improved.

10 Claims, 5 Drawing Sheets

NON-LINEAR SIGNAL CORRECTION

FIELD OF THE INVENTION

The present invention relates generally to signal acquisition and, more particularly, to correction of a non-linear signal.

BACKGROUND OF THE INVENTION

Various electronic sensors, data acquisition systems and other electronic systems using a bandgap reference for data processing are used in a variety of applications, such as for acquiring information in manufacturing, testing, analysis and other experimental and industrial applications. In these and other applications, obtaining accurate data is important.

Particular applications for which data collection is important include sensing various characteristics, such as temperature, pressure and others. In many applications, a bandgap voltage reference forms an essential part of a sensor system. The voltage reference provides the reference signal that is used to convert the sensor's characteristic dependent voltage into the digital domain. Given the availability of an accurate signal in the form of a voltage, the overall accuracy of a sensor is determined by the accuracy of the bandgap reference.

For example, many conventional bandgap references show a non-linear dependence, or curvature. This curvature causes a non-linear temperature dependent error in the output of a sensor based on such a bandgap reference. Many methods have been used to correct the curvature of a bandgap reference circuit, though not necessarily in the context of a sensor. Example categories of such methods include methods that change the bias current of the bipolar transistors in the reference and methods that generate a non-linear correction signal that is added to the output of the original reference; e.g. a piece-wise linear correction, an exponential correction, or a quadratic correction.

In these and other methods, many cancellation methods are limited in use to specific applications. These challenges inhibit the ability to obtain an accurate signal in a variety of applications.

SUMMARY OF THE INVENTION

The present invention is directed to the correction of a non-linear signal in various applications. The present invention is exemplified in a number of implementations and applications, some of which are summarized below.

According to an example embodiment of the present invention, a non-linear output signal from a data acquisition circuit is corrected using a bipolar transistor circuit having a base-emitter voltage. A corrected output corresponding to a detectable characteristic is determined as a function of the base-emitter voltage, an input corresponding to the detectable characteristic and the divisions of a plurality of division circuits. The corrected output exhibits a cancelled non-linearity of at least second order.

According to another example embodiment of the present invention, a system is adapted to provide a corrected output signal from a data acquisition circuit using bipolar transistor circuit having a base-emitter voltage, wherein the output signal corresponds to a detectable characteristic, such as temperature, pressure or other characteristic and exhibits a cancelled non-linearity of at least second order. The system includes a signal generation arrangement adapted to generate a non-linear signal. The generated non-linear signal is adapted to cancel a non-linearity of the output signal. A correction circuit is adapted to provide a corrected output corresponding to the detectable characteristic and to determine a corrected output as a function of the base-emitter voltage, the non-linear output signal and the generated non-linear signal.

In another example embodiment of the present invention, two or more division circuits are used in a data acquisition system to improve the output of the system. The division circuits are used in conjunction with a plurality of input signals to produce an output signal that exhibits corrected non-linear signal that represents a parameter upon which at least one of the input signals depends.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
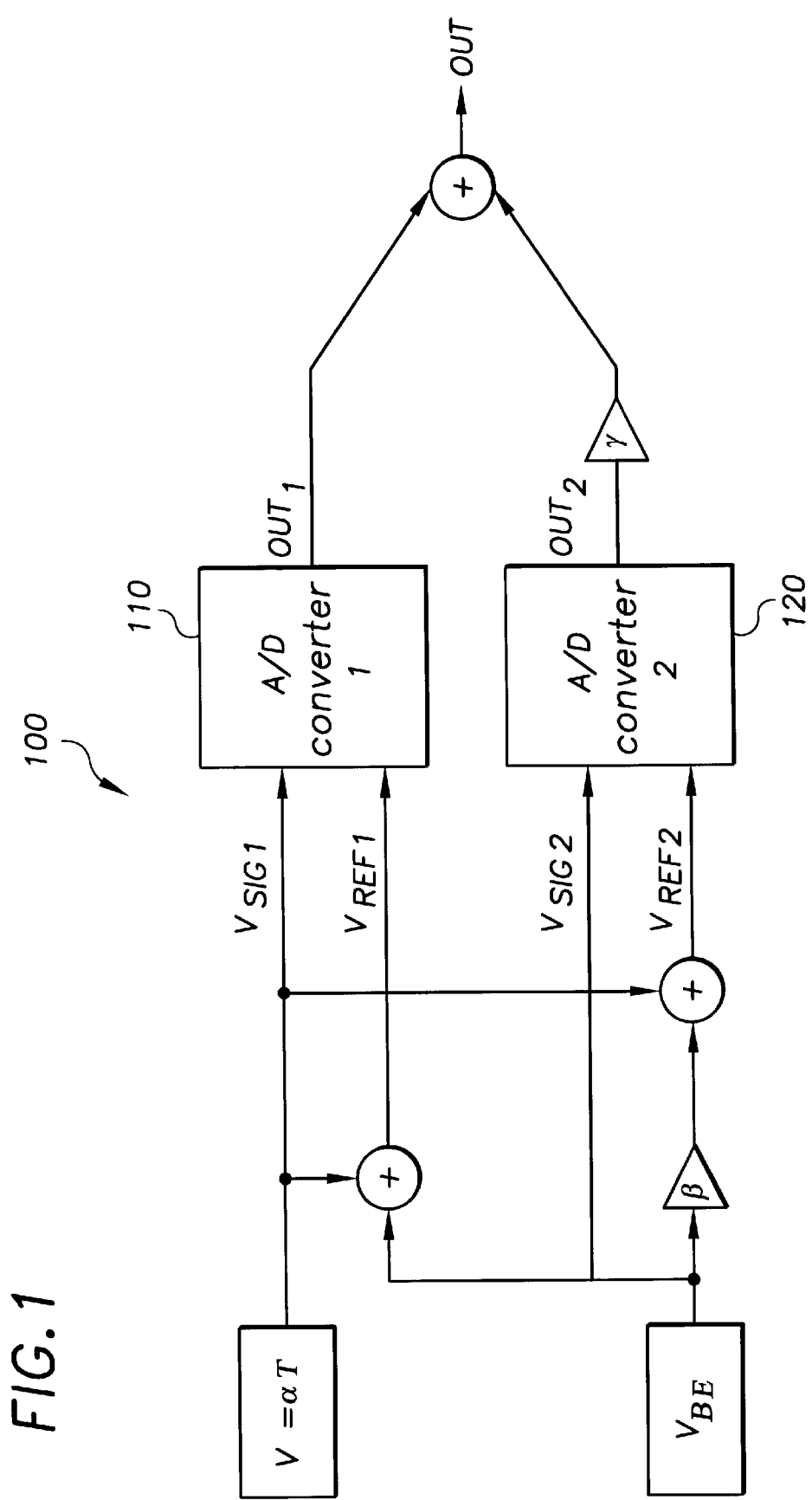
FIG. 1 shows third-order signal correction, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types signal acquisition, and the invention has been found particularly suited for signal acquisition benefiting from non-linear signal correction. While the present invention is not necessarily limited to such applications, various aspects of the invention may be appreciated through a discussion of various examples using this context.

According to an example embodiment of the present invention, a non-linear output signal of a data acquisition circuit is corrected using a bandgap reference voltage from, for example from a bipolar transistor. The output signal corresponds to a detectable characteristic, such as temperature, pressure, data or other characteristic. The non-linearity includes second and/or higher-order non-linear terms, and includes non-linear terms representing curvature in a bandgap reference. The corrected output signal is determined as a function of an input signal, a base-emitter voltage of the transistor and a generated non-linear signal. The generated non-linear signal is adapted to cancel the non-linearity of the output signal. In this manner, correction of second and higher-order non-linear signals in various data acquisition systems is made possible, such as in a smart temperature sensor wherein the non-linearity originates from the curvature of the bandgap reference in that sensor.

In a more particular example embodiment of the present invention, a corrected output signal is generated by obtaining a first output signal and adding a generated non-linearity to it. The first output signal is obtained from a data acquisition circuit by dividing an output-proportional signal voltage from the data acquisition circuit by the sum of a base-emitter voltage from the bipolar transistor circuit and the output-proportional signal voltage. The output-proportional signal voltage corresponds to a detectable characteristic such as, for example, temperature, pressure, or other characteristic for which a signal is desired to be obtained.

The corrected signal is created using the following steps: First, the product of the base-emitter voltage and a first coefficient is obtained by multiplying each together. The first coefficient is selected based on the particular application for which the non-linearity is generated. Next, the base-emitter voltage is divided by a sum of the output-proportional signal voltage and the product of the base-emitter voltage and the first coefficient. The result of the division is multiplied by a second coefficient selected based on the particular application, and the multiplied result is the generated non-linearity. The result is added to the first output signal, and cancels the non-linearity included therein. Once the corrected result is obtained, it is used as a corrected indication of the detectable characteristic, and can be further used in other implementations and applications, such as for performing further calculations and for electronic control. The result can also be manipulated for selected use, such as by scaling the result.

In another example embodiment of the present invention, a non-linear curvature present in an output from a bipolar transistor circuit used in a sensor is corrected as shown in FIG. 1. The bipolar transistor circuit has outputs including a base-emitter voltage and a voltage signal output V that corresponds to the temperature of the sensor. The signal voltage, VSIG1, is represented by the following equation, with T being representative of a detectable characteristic, such as temperature:

$$V_{SIG1} = V = \alpha T.$$

This voltage is converted to a digital representation OUT1= VSIG1/VREF1 using an A/D converter 110 with reference voltage VREF1. In this example application, VSIG1 is a proportional to absolute temperature (PTAT) voltage, and VREF1 is a bandgap reference voltage that consists of the sum of a base-emitter voltage (VBE) from the transistor and the output voltage V, as shown in the following equation:

$$V_{REF1} = V_{BE} V.$$

A second output OUT2 includes a non-linearity that is used to cancel the non-linearity in the first output OUT1. The sensor's final output OUT consists of the sum of $$OUT(T) = OUT_1(T) + \gamma OUT_2(T) = \frac{V_{SIG1}(T)}{V_{REF1}(T)} + \gamma \frac{V_{SIG2}(T)}{V_{REF2}(T)}.$$

The second output is generated using a second A/D converter 120 that generates second-order and third-order non-linearity that cancels the non-linearity of the first A/D converter 110. The base-emitter voltage VBE is used as a signal input VSIG2, and VREF2, defined as $$V_{REF2} = V + \beta V_{BE},$$

is used as a reference input. The coefficients $\beta$ and $\gamma$ are selected as follows:

$$\beta = \frac{\lambda T_r(2V_{BE0} + 3V_{g0})}{\lambda T_r(2V_{BE0} + 3V_{g0}) + V_{BE0}(V_{BE0} - 3V_{g0})} \text{ and}$$

$$\gamma = 27\frac{(V_{BE0} - V_{g0})V_{BE0}^2}{(V_{BE0} + 3V_{g0})(2V_{BE0} + 3V_{g0})^2}\beta^2,$$

where $$V_{BE0} = V_{g0} + \frac{kT_r}{q}(\eta - 1)$$

$$\lambda = \frac{V_{BE0} - V_{BE}(T_r)}{T_r},$$

wherein Vg0 is an extrapolation of the bandgap voltage to 0° K (Kelvin), k is the Boltzmann constant (1.38·10−23 J/K), q is the electron charge (1.6·10−19 C), η is a process dependent constant (e.g. 4.75), and Tr is a reference temperature (e.g. 300K). The combined output is represented as:

$$OUT(T) = \frac{\lambda T_r}{V_{BE0}} + \gamma\frac{V_{BE0} + \lambda T_r}{\beta V_{BE0} - (\beta - 1)\lambda T_r} +$$

$$2\frac{\lambda}{V_{BE0}}\frac{3V_{g0} - V_{BE0}}{3V_{g0} + V_{BE0}}(T - T_r) + O((T - T_r)^4).$$

Other implementations of the present invention applicable to the above-mentioned correction for achieving selected results may be apparent to those skilled in the art. For instance, remaining changes in the output at the reference temperature OUT(Tr) and the first-order temperature coefficient can be corrected in the digital domain. In addition, various other linear combinations of V and VBE for VSIG1, VREF1, VSIG1 and VSIG2 are made for selected applications, such as to ease the implementation of the correction functions performed or to use the dynamic range of the A/D converters more effectively. In addition, the A/D converters in the above description can be replaced by any converter that performs a division, such as a duty-cycle modulator, in which case the output would be a time-domain signal, or an analog divider, in which case the output would be in the analog domain.

Figure 2:
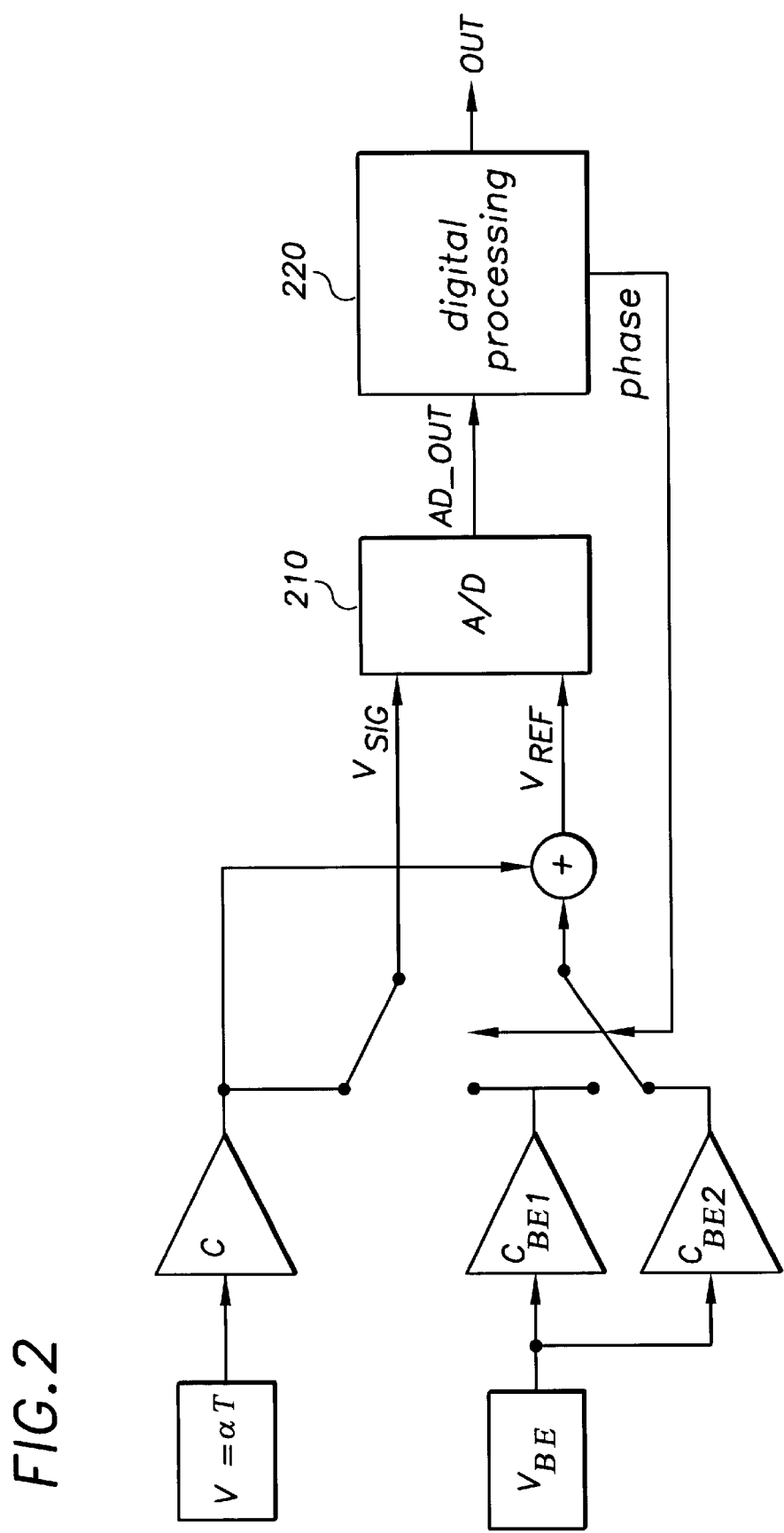
FIG. 2 shows third-order signal correction, according to another example embodiment of the present invention.

FIG. 2 shows an implementation of a temperature sensor with digital output and third-order curvature correction, according to another example embodiment of the present invention. The gains c, cBE1 and cBE2 and the coefficient α satisfy the following criteria:

$$\frac{c_{BE2}}{c_{BE1}} = \beta$$

$$\alpha c = \lambda c_{BE1},$$

wherein $\beta$ and $\lambda$ are given hereinabove. The remaining freedom in choosing c, cBE1, cBE2 and a can be used to satisfy other design criteria.

The correction is implemented with a single A/D 210 using time division multiplexing. The combined output OUT is generated from the A/D converter's output AD_OUT by a microcontroller or dedicated hardware, represented by digital processing block 220. The digital signal phase generated by the digital processing block changes the input signals of the A/D converter. The digital processing block goes through the following steps to produce the output OUT:

1. set phase:=0;
2. make the A/D converter produce a new conversion result;
3. store that result: OUT1:=AD_OUT;
4. set phase:=1;
5. make the A/D converter produce a new conversion result;
6. store that result: OUT2:=AD_OUT;
7. calculate the combined output: OUT:=OFFSET+GAIN (OUT1+γOUT2);

where γ is given hereinabove. The OFFSET and GAIN parameters are chosen such that the desired output format is obtained, e.g. a reading in ° C.

Figure 3:
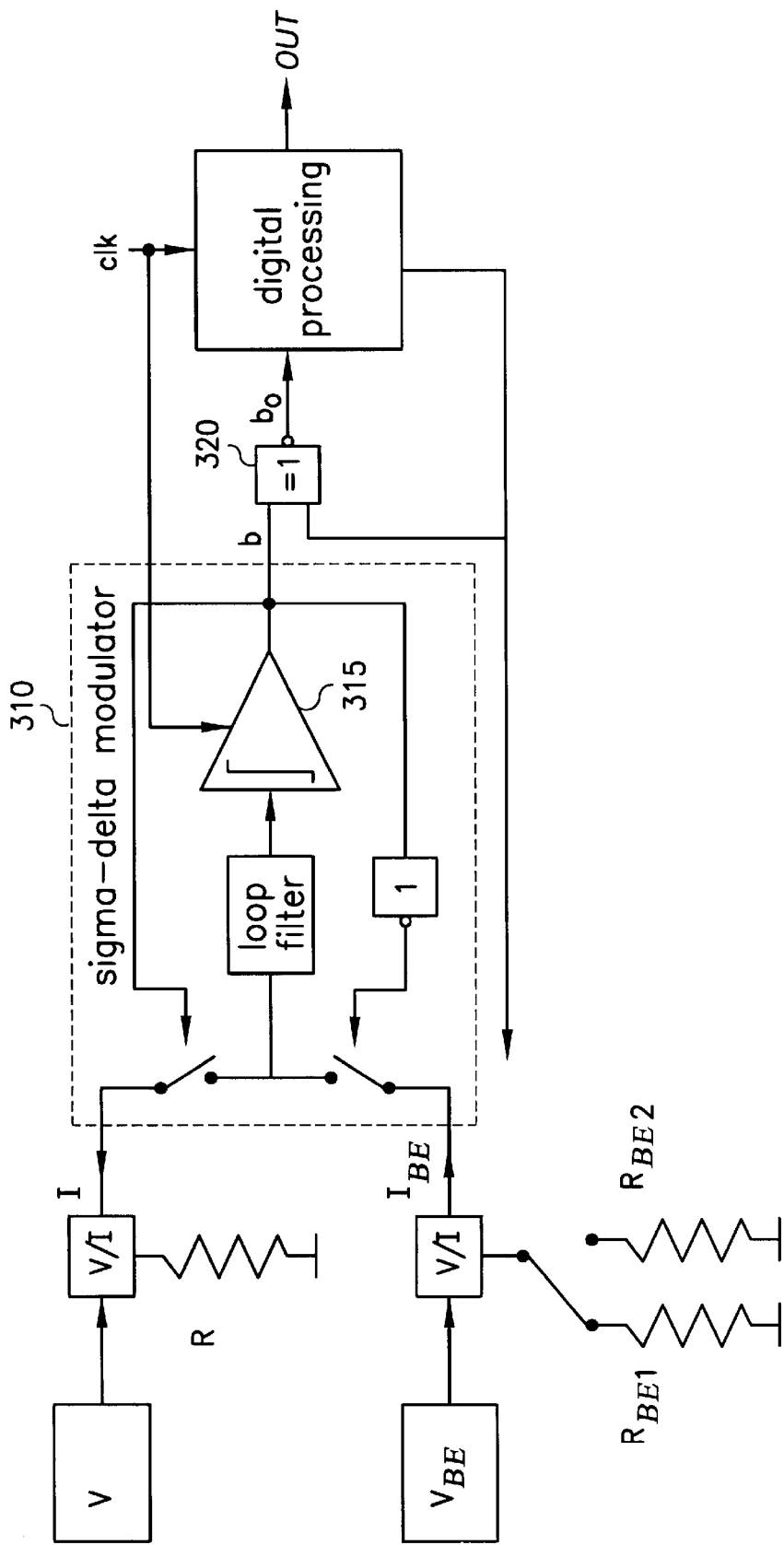
FIG. 3 shows third-order signal correction using a sigma-delta A/D converter, according to another example embodiment of the present invention.

FIG. 3 is another example embodiment of the present invention, wherein a sigma-delta A/D modulator 310 having current inputs is used to implement the configuration shown in FIG. 2. The coefficients C, CBE1 and CBE2 are implemented as two voltage-to-current converters with resistors R, RBE1 and RBE2, producing currents I=V/R and IBE=VBE/RBE, where RBE=RBE1 for phase=0 and RBE=RBE2 for phase=1. The bitstream b at the output of a clocked comparator 315 will have an average value $$\langle b \rangle = \frac{I_{BE}}{I + I_{BE}}.$$

An xnor port 320 inverts this bitstream when phase=0, yielding $$\langle bitstream \rangle = \begin{cases} 1 - \langle b \rangle = \frac{1}{I + I_{BE}} & \text{for phase} = 0 \\ \langle b \rangle = \frac{I_{BE}}{I + I_{BE}} & \text{for phase} = 1, \end{cases}$$

which corresponds to the two A/D conversion results OUT1 and OUT2 in FIG. 1. The coefficients γ, GAIN and OFFSET are implemented digitally in a decimation filter.

In an alternate to the above example implementation of the present invention, the sigma-delta modulator in is replaced by a different type of modulator that produces an output signal for which the above bitstream equation can be implemented with an xnor-port. For example, an asynchronous modulator that can be used in place of the sigma-delta modulator is a duty-cycle modulator.

Figure 4:
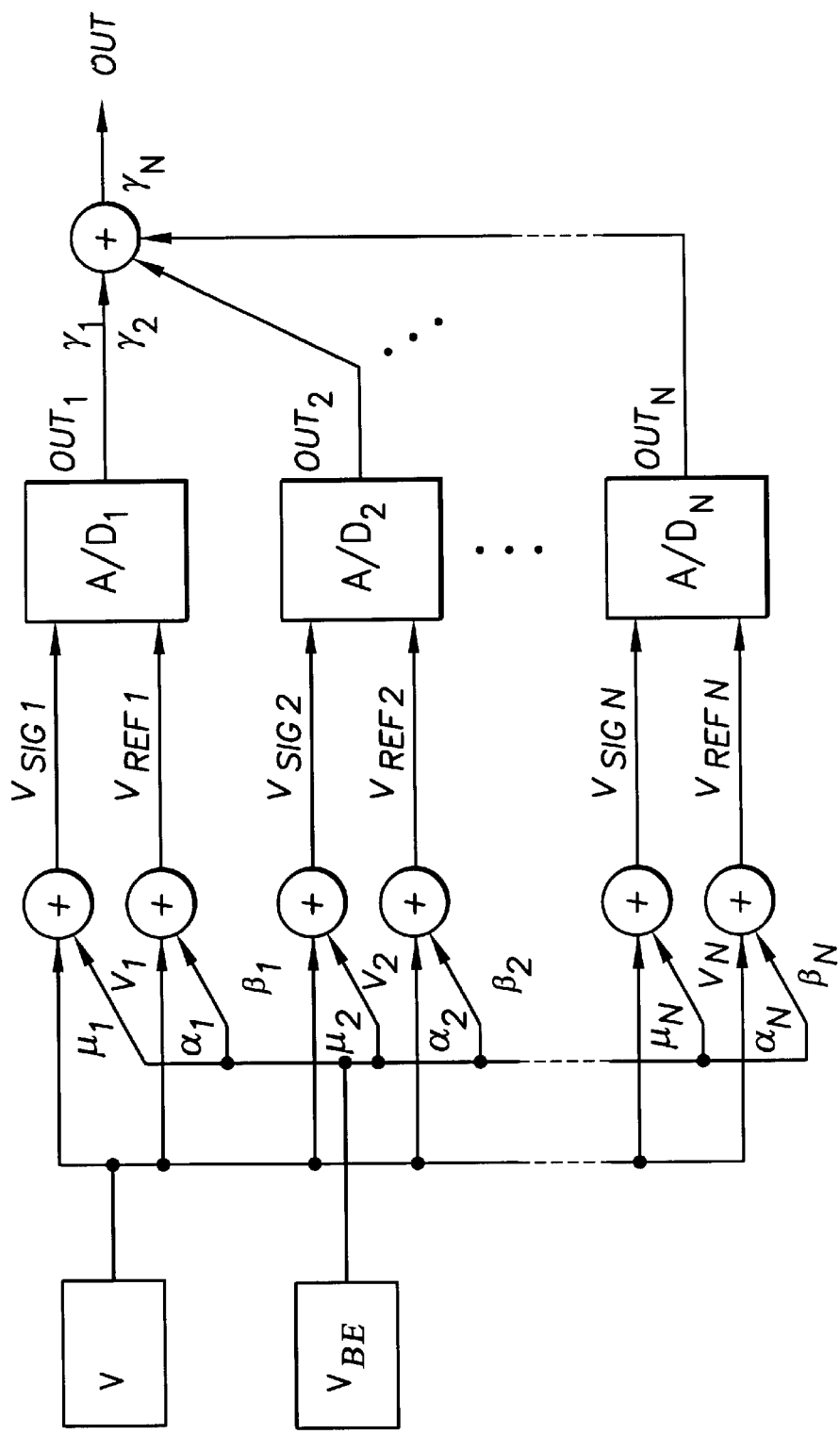
FIG. 4 shows higher than third-order signal correction, according to another example embodiment of the present invention.

In another example embodiment of the present invention, the third-order correction described hereinabove is extended to higher order by increasing the number of A/D conversions used to obtain the sensor's output OUT, as shown in FIG. 4. The signal input and the reference inputs of each of the A/D converters A/D1 through A/DN are linear combinations of V and VBE, and are represented as:

$$V_{SIGi} = \mu_i V = \nu V_{BE}$$

and $$V_{REFi} = \alpha_i V + \beta_i V_{BE}.$$

The output is a linear combination of the N A/D converter outputs:

$$OUT(T) = \sum_{i=1}^{N} \gamma_i OUT_i(T)$$
$$= C_0 C_1 (T - T_r) + \varepsilon_2 (T - T_r)^2 + \varepsilon_3 (T - T_r)^3 + \varepsilon_4 (T - T_r)^4 + \ldots \ .$$

For mth-order curvature correction, the coefficients μi, vi, αi and βi are chosen such that C0 and C1 have desired values and εn=0 for 2≦n≦m. Remaining freedom in the coefficients can be used to satisfy other design criteria. The coefficients are determined by solving them numerically.

Figure 5:
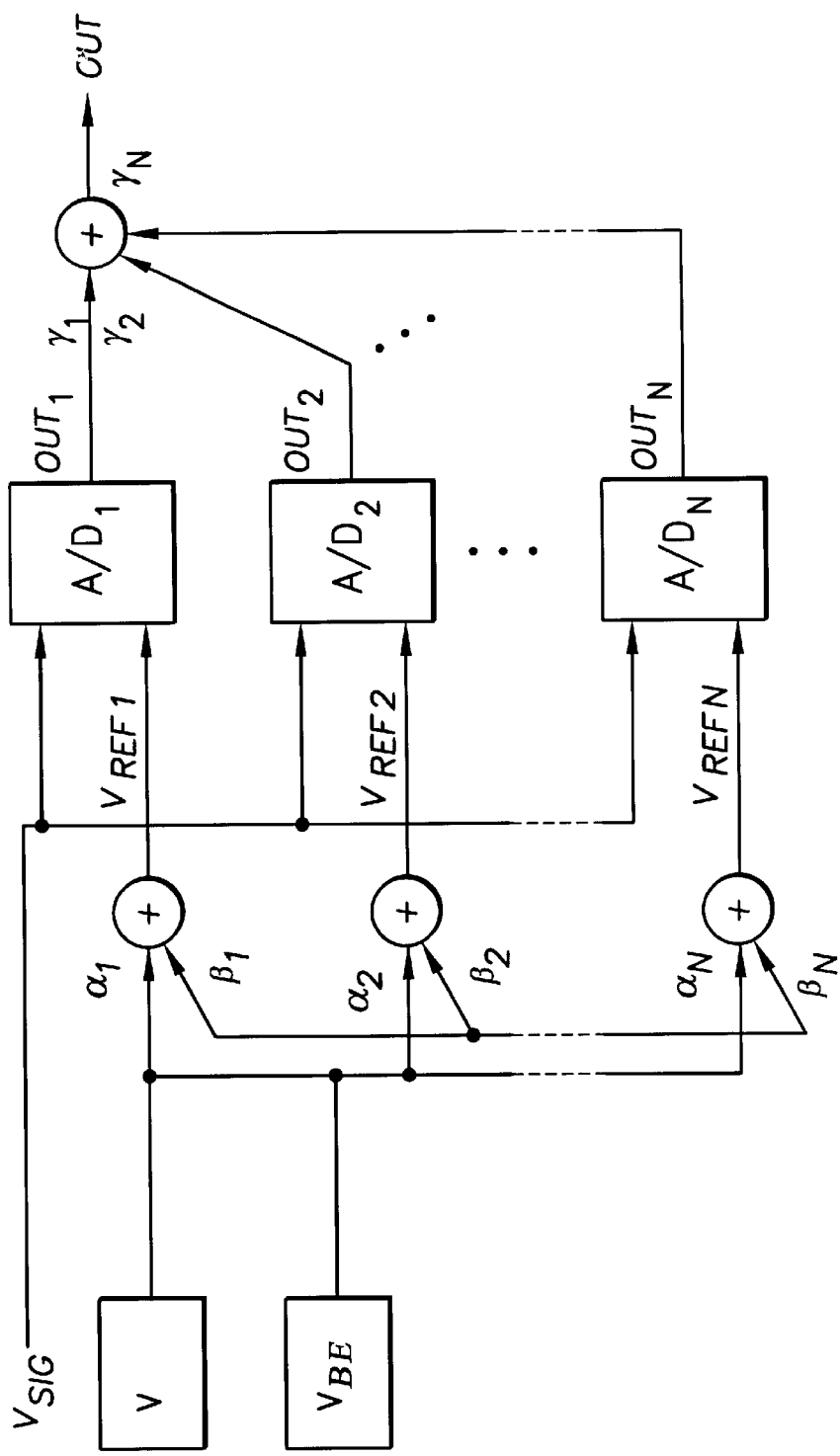
FIG. 5 shows higher than third-order signal correction, according to another example embodiment of the present invention.

The higher-order curvature correction described above can be applied in temperature sensors, as well as in general data-acquisition systems, where an arbitrary input signal is converted to a digital representation using a bandgap reference, and wherein slight modifications to the correction can be made to tailor the correction to specific applications. For example, FIG. 5 shows an application for higher-order curvature correction in a general data-acquisition system, according to another example embodiment of the present invention. The reference inputs of A/D converters A/D1 through A/DN are linear combinations of V and VBE, and the signal inputs are connected to the input of a data-acquisition system, VSIG. The output is again a linear combination of the A/D converter outputs:

$$OUT(T) = \sum_{i=1}^{N} \gamma_i OUT_i$$
$$= \frac{SIG}{REF}(1 + \varepsilon_1 (T - T_r) + \varepsilon_2 (T - T_r)^2 +$$
$$+ \varepsilon_3 (T - T_r)^3 + \varepsilon_4 (T - T_r)^4 + \ldots \ ).$$

Any temperature dependence of the output is cancelled. For mth-order curvature correction, the coefficients αi and βi (FIG. 5) are chosen such that REF has a desired value and εn=0 for 1≦n≦m. Remaining freedom in the coefficients can be used to satisfy other design criteria, and the coefficients are determined by solving them numerically. The number of A/D conversions needed to obtain mth-order correction will in general be larger or equal to the number needed in a temperature sensor with the correction of the same order, because the number of equations that has to be satisfied is larger and the number of free variables is smaller.

The present invention is applicable to a variety of applications, some of which are described in the following references, all of which are incorporated herein by reference:

[1] A. van Staveren, J. van Velzen, C. J. M. Verhoeven, and A. H. M. van Roermund, "An integratable second-order compensated bandgap reference for 1 V supply", Analog Integrated Circuits and Signal Processing, vol. 8, no. 1, July 1995, pp. 69–81.

[2] W. T. Holman, "A new temperature compensation technique for bandgap voltage references", 1996 IEEE International Symposium on Circuits and Systems, 1996, vol. 1, pp. 385–8.

[3] B. S. Song and P. R. Gray, "A precision curvature-compensated CMOS bandgap reference", IEEE Journal of Solid State Circuits, vol. SC-18, no. 6, December 1983, pp. 634–43.

[4] G. Rincon-Mora and P. E. Allen, "A 1.1-V current-mode and piecewise-linear curvature-corrected bandgap reference", IEEE Journal of Solid State Circuits, vol. 33, no. 10, October 1998, pp. 1551–4.

[5] I. Lee, G. Kim, and W. Kim, "Exponential curvature-compensated BiCMOS bandgap references", IEEE Journal of Solid State Circuits, vol. 29, no. 11, November 1994, pp. 1396–403.

[6] M. Gunawan, G. C. M. Meijer, J. Fonderie, and J. H. Huijsing, "A curvature-corrected low-voltage bandgap reference", IEEE Journal of Solid State Circuits, vol. 28, no. 6, June 1993, pp. 667–70.

[7] G. C. M. Meijer, R. van Gelder, V. Nooder, J. van Drecht, and H. Kerkvliet, "A three-terminal integrated temperature transducer with microcomputer interfacing", Sensors and Actuators, no. 18, 1989, pp. 195–206 (see Appendix).

For another example embodiment of the present invention and related discussion thereto, reference may be made to the attached Appendix.

While the present invention has been described with reference to several particular example embodiments, those skilled in the art will recognize that many changes may be made thereto without departing from the spirit and scope of the present invention, which is set forth in the following claims.

What is claimed is:

1. For use with a data acquisition circuit having a voltage input and an input signal corresponding to a detectable characteristic, a method for providing a corrected output signal that represents the detectable characteristic, the method comprising:

obtaining a first output signal by dividing the input signal by a sum of the voltage input and the input signal using one of a plurality of division circuits;

obtaining a second output signal by dividing the voltage input by the sum of the input signal and a product using one of the plurality of division circuits, the product being the voltage input multiplied by a first coefficient selected and adapted for signal correction;

multiplying the second output signal by a second coefficient selected and adapted for signal correction and obtaining a third output signal;

adding the first output signal with the third output signal to obtain a corrected output from the data acquisition circuit, the corrected output exhibiting a canceled non-linear function of at least a second order; and providing the corrected output corresponding to the detectable characteristic.

2. The method of claim 1, wherein dividing the input signal and dividing the voltage input include using at least one of: an A/D converter, a duty-cycle modulator and an analog divider.

3. The method of claim 1, wherein dividing the input signal and dividing the voltage input include using the single division circuit that is time-multiplexed to perform the divisions in sequence.

4. The method of claim 3, wherein dividing the input signal and dividing the voltage input include passing an output from the single division circuit through an XNOR circuit and passing the output of the XNOR circuit through a decimation filter adapted to provide a corrected output signal using the output from the XNOR circuit.

5. The method of claim 1, wherein the voltage input includes a base-emitter voltage from a bipolar transistor.

6. For use with a data acquisition circuit having a plurality of division circuits and a plurality of inputs that include a base-emitter voltage, a PTAT voltage and an input signal corresponding to a detectable characteristic, the method comprising:

for each of the plurality of division circuits, obtaining a first output signal by using a first one of the plurality of division circuits to divide the input signal by a sum of the PTAT voltage multiplied by a first coefficient and the base-emitter voltage multiplied by a second coefficient;

obtaining a second output signal by using a second one of the plurality of division circuits to divide the input signal by the sum of the PTAT voltage multiplied by a third coefficient and the base-emitter voltage multiplied by a fourth coefficient;

multiplying the first output signal by a coefficient selected and adapted for signal correction;

multiplying the second output signal by a coefficient selected and adapted for signal correction; and adding the multiplied first and second output signals to obtain a corrected output from the data acquisition circuit, wherein each of the coefficients are selected for use with each particular division circuit and are not necessarily the same.

7. A data acquisition circuit having a voltage input and an input signal corresponding to a detectable characteristic, the circuit comprising:

at least two division circuits for receiving said voltage input and said input signal; and a circuit coupled to said at least two division circuits and adapted to provide a corrected adapted to provide a corrected detectable characteristic as a function of the voltage input, the input signal and divisions from the voltage input and the input signal derived using the division circuits, the corrected output exhibiting a cancelled non-linear function of at least second order.

8. The data acquisition circuit of claim 7, wherein the circuit includes a first division circuit adapted to divide the voltage input by the sum of the voltage input multiplied by a coefficient adapted for signal correction and the input signal, and wherein the circuit includes a second division circuit adapted to divide the input signal by the sum of the input signal and the voltage input, further comprising:

a multiplication circuit adapted to multiply the output of the first division circuit by a coefficient adapted for signal correction; and an addition circuit adapted to add the output of the second division circuit to the multiplied output of the first division circuit to provide the correct output.

9. A data acquisition circuit comprising:

a bipolar transistor circuit having a base-emitter voltage;

a conversion circuit adapted to convert the base-emitter voltage to a base-emitter current signal having characteristics selected for signal correction;

a PTAT voltage circuit having a PTAT voltage corresponding to a detectable characteristic;

a conversion circuit adapted to convert the PTAT voltage to a PTAT current signal having characteristics selected for signal correction;

a modulator circuit adapted for use in time-division multiplexing and having at least two inputs, the modulator circuit being adapted to divide the PTAT current signal by a sum of the PTAT current signal and the base-emitter current signal to obtain a first generated output signal, and wherein a division circuit is adapted to divide the base-emitter current signal by the sum of the PTAT current signal and the base-emitter current signal to obtain a second generated output signal;

an XNOR port coupled to an output of the modulator circuit; and a decimation filter coupled to an output of the XNOR port and adapted to apply at least one coefficient to the output, the application of the coefficient being selected for signal correction, wherein an output of the decimation filter exhibits a corrected non-linearity of at least second order.

10. A data acquisition circuit comprising:

a bipolar transistor circuit having a base-emitter voltage;

a PTAT voltage circuit having a PTAT voltage;

a circuit adapted to detect an input signal from a detectable characteristic;

a plurality of division circuits, each circuit having at least two inputs, wherein a first one of the plurality of division circuits is adapted to divide the detected input signal by the sum of the PTAT voltage multiplied by a first coefficient and the base-emitter voltage multiplied by a second coefficient to obtain a first generated output signal and wherein a second one of the plurality of division circuits is adapted to divide the detected input signal by the sum of the PTAT voltage multiplied by a third coefficient and the base-emitter voltage multiplied by a fourth coefficient to obtain a second generated output signal;

a first multiplying circuit adapted to multiply the first generated output signal by a coefficient selected and adapted for signal correction;

a second multiplying circuit adapted to multiply the second generated output signal by a coefficient selected and adapted for signal correction; and an addition circuit adapted to add the multiplied first and second generated output signals to obtain a corrected output from the data acquisition circuit, the corrected output exhibiting a corrected non-linearity of at least second order, wherein each of the coefficients are selected for use with each particular division circuit and are not necessarily the same.

* * * * *